(12) United States Patent
Dubin

(10) Patent No.: US 6,249,055 B1
(45) Date of Patent: *Jun. 19, 2001

(54) SELF-ENCAPSULATED COPPER METALLIZATION

(75) Inventor: Valery Dubin, Cupertino, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/017,676

(22) Filed: Feb. 3, 1998

(51) Int. Cl.$^7$ .................................... H01L 23/48
(52) U.S. Cl. .................. 257/758; 257/751; 257/752; 257/762; 257/765
(58) Field of Search ................... 257/751, 752, 257/758, 762, 763, 765, 767, 771, 774; 438/622, 626, 627

(56) References Cited

U.S. PATENT DOCUMENTS

| | | | |
|---|---|---|---|
| 4,789,648 | 12/1988 | Chow et al. | 438/633 |
| 5,592,024 | * 1/1997 | Aoyama et al. | 257/751 |
| 5,604,156 | * 2/1997 | Chung et al. | 438/620 |
| 5,766,379 | * 6/1998 | Lanford et al. | 148/537 |
| 5,913,147 | * 6/1999 | Dubin et al. | 438/687 |
| 5,933,758 | * 8/1999 | Jain | 438/687 |
| 6,160,315 | * 12/2000 | Chiang et al. | 257/762 |

OTHER PUBLICATIONS

P.J. Ding et al. "Effects of the addition of small amounts of Al to copper: corrosion, resistivity, adhesion, morphology, and diffusion", Journal of Applied Physics, vol. 15, No. 7, Apr. 1994, pp. 3627–3631.

* cited by examiner

Primary Examiner—Steven Loke
Assistant Examiner—Hung Kim Vu

(57) ABSTRACT

Copper or copper alloy interconnection patterns are formed by a damascene technique. An aluminum or magnesium alloy is deposited in a damascene opening formed in a dielectric layer. Copper or a copper alloy is then electroplated or electroless plated on the aluminum or magnesium alloy, filling the opening. During low temperature annealing, aluminum or magnesium atoms diffuse through the copper or copper alloy layer and accumulate on its surface forming a self-encapsulated oxide to prevent corrosion and diffusion of copper atoms.

2 Claims, 7 Drawing Sheets

SELF-ENCAPSULATED COPPER METALLIZATION

TECHNICAL FIELD

The present invention relates to electroplated or electroless plated copper or copper alloy metallization. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer is typically removed by chemical-mechanical polishing (CMP) One such method is known as damascene and basically involves the formation of an opening which is filled in with a metal. Dual damascene techniques involve the formation of an opening comprising a lower contact or via hole section in communication with an upper trench section, which opening is filled with a conductive material, typically a metal, to simultaneously form a conductive plug in electrical contact with a conductive line. In copending application Ser. No. 08/320,516 filed on Oct. 11, 1994, prior art single and dual damascene techniques are disclosed, in addition to several improved dual damascene techniques simultaneously forming a conductive line in electrical contact with a conductive plug for greater accuracy in forming fine line patterns with minimal interwiring spacings.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

If the interconnection node is routed over a considerable distance, e.g., hundreds of microns or more, as in submicron technologies, the interconnection capacitance limits the circuit node capacitance loading and, hence, the circuit speed. As integration density increases and feature size decreases in accordance with submicron design rules, the rejection rate due to integrated circuit speed delays approaches and even exceeds 20%.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by CMP. Al is conventionally employed because it is relatively inexpensive, exhibits low resistivity and is relatively easy to etch. However, as the size of openings for vias/contacts and trenches is scaled down to the sub-micron range, step coverage problems have arisen involving the use of Al which has decreased the reliability of interconnections formed between different wiring layers. Such poor step coverage results in high current density and enhanced electromigration. Moreover, low dielectric constant polyamide materials, when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Copper (Cu) and Cu alloys have received considerable attention as a candidate for replacing Al in VLSI interconnect metallizations. Cu exhibits superior electromigration properties and has a lower resistivity than Al. In addition, Cu has improved electrical properties vis-à-vis W, making Cu a desirable metal for use as a conductive plug as well as conductive wiring.

Electroless plating and electroplating of Cu and Cu alloys offer the prospect of low cost, high throughput, high quality plated films and efficient via, contact and trench filling capabilities. Electroless plating generally involves the controlled autocatalytic deposition of a continuous film on the catalytic surface by the interaction in solution of a metal salt and a chemical reducing agent. Electroplating comprises the electro deposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100 Å, can be employed in the form of islets of catalytic metal.

There are disadvantages attendant upon the use of Cu or Cu alloys. For example, Cu is easily oxidized and vulnerable to corrosion. Unlike Al, Cu does not form a self-passivating oxide on its surface. Accordingly, corrosion of Cu is an important issue which requires resolution before Cu can be effectively utilized in many semiconductor device applications. Moreover, Cu readily diffuses through silicon dioxide, the typical dielectric interlayer material employed in the manufacture of semiconductor devices, into silicon elements and adversely affects device performance.

One approach to forming Cu plugs and wiring comprises the use of damascene structures employing CMP, as in Chow et al., U.S. Pat. No. 4,789,648. However, due to Cu diffusion through dielectric interlayer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

In copending application Ser. No. 08/857,129, filed May 15, 1997, now U.S. Pat. No. 5,969,422, issued Oct. 19, 1999 a method of electroless plating or electroplating copper or a copper alloy to fill high aspect ratio openings is disclosed, wherein a seed layer comprising an alloy of a refractory metal and one or more additive metals is initially deposited.

Copending application Ser. No. 08/587,264, filed Jan. 16, 1996, discloses a method of electrolessly depositing Cu in an interconnect structure, which method comprises initially depositing a barrier layer in an opening, depositing a catalytic seed layer, preferably of Cu, on the barrier layer, and then depositing a protective layer the catalytic layer encapsulating and protecting the catalytic layer from oxidation. The preferred protective material is Al which forms an Al—Cu alloy at the interface of the catalytic and protective layers, thereby encapsulating the underlying Cu. Subsequently, Cu is electrolessly deposited from an electroless deposition solution which dissolves the overlying protective alloy layer to expose the underlying catalytic Cu layer.

Al has been suggested as a doping material to improve the oxidation and corrosion resistance of Cu and act as a diffusion barrier by forming a thin protective layer of aluminum oxide on the surface of a Cu layer upon annealing. P. J. Ding et al., "Effects of the Addition of Small Amounts of Al to Copper: Corrosion, Resistivity, Adhesion, Morphology, and Diffusion". J. Appl. Phys., 75(7) 1994, 3627–3631. Magnesium (Mg) has also been suggested as a doping material to improve the oxidation resistance of Cu.

There exists a need for semiconductor technology enabling the formation of Cu or Cu alloy metallization in interconnection patterns with improved corrosion resistance while substantially reducing or eliminating Cu diffusion.

DISCLOSURE OF THE INVENTION

An object of the present invention is a method electroplating or electroless plating Cu or Cu alloy metallization having high corrosion resistance without any substantial Cu diffusion.

Another object of the present invention is a semiconductor device comprising Cu or Cu alloy metallization exhibiting high corrosion resistance without any substantial Cu diffusion.

Additional objects, advantages and other features of the invention will be set forth in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor, which method comprises: forming an opening in a dielectric layer; depositing a metal layer comprising an aluminum alloy or a magnesium alloy lining the opening; electroplating or electroless plating Cu or a Cu alloy on the metal layer to form a plated layer filling the opening; and annealing to diffuse aluminum or magnesium atoms from the metal layer through the plated layer, which Al or Mg atoms accumulate on the surface of the plated layer.

Another aspect of the present invention is a semiconductor device having an interconnection pattern comprising: a dielectric layer having an opening therein; and a composite metal layer inlaid in the opening, the composite metal layer comprising: a metal layer comprising an aluminum or a magnesium alloy lining the opening; a plated layer comprising electroplated or electroless plated copper or a copper alloy on the metal layer filling the trench; and a layer of aluminum oxide or magnesium oxide on and encapsulating the plated layer.

Additional objects and advantages of the present invention will become readily apparent to those skilled in this art from the following detailed description, wherein embodiments of the invention are described simply by way of illustrating of the best mode contemplated in carrying out the invention. As will be realized, the invention is capable of other and different embodiments, and its several details are capable of modifications in various obvious respects, all without departing from the invention. Accordingly, the drawings and description are to be regarded as illustrative in nature and not as restrictive.

DESCRIPTION OF THE INVENTION

Figure 1:
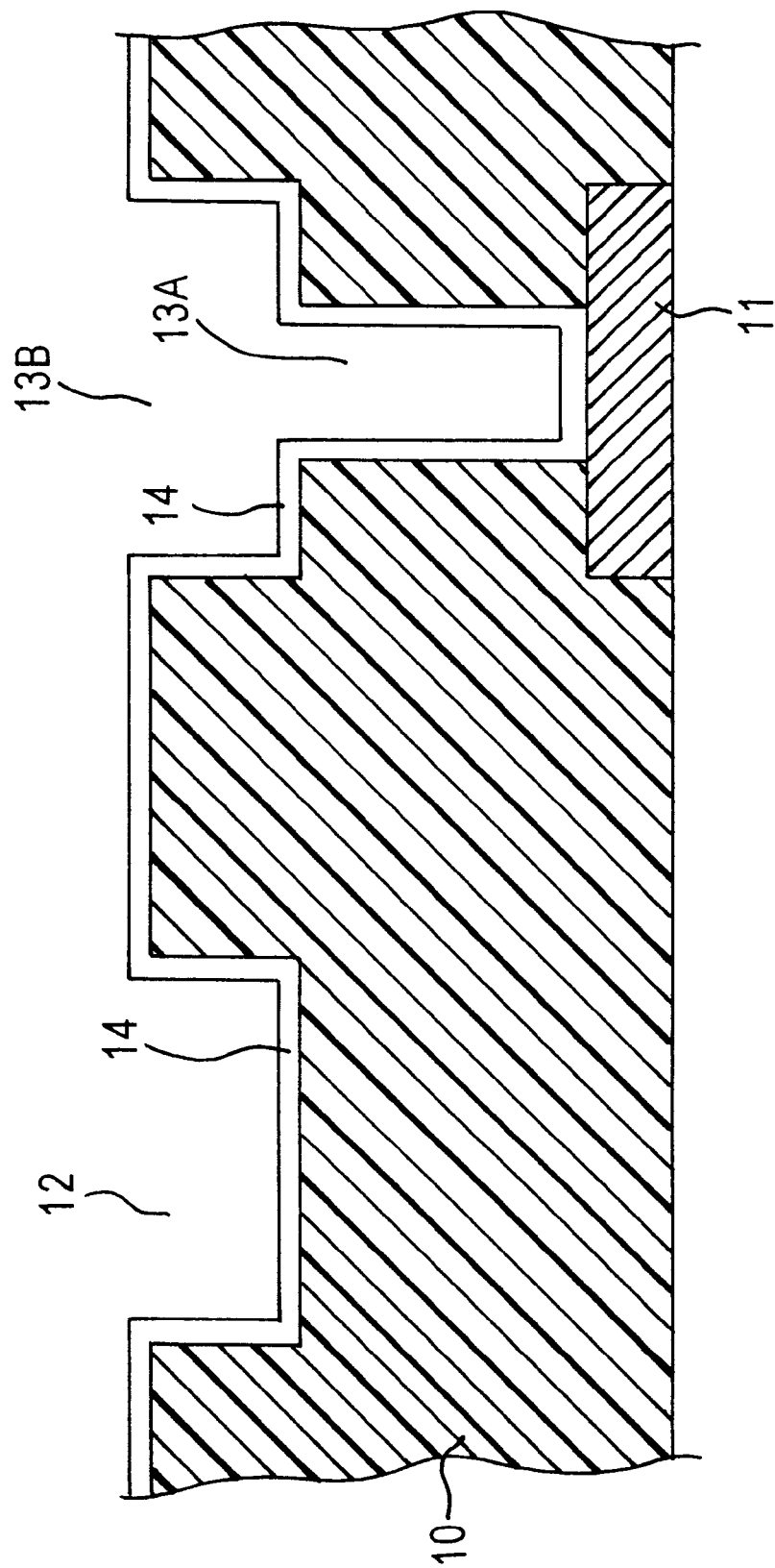
FIGS. 1–4 illustrate sequential phases of a method in accordance with an embodiment of the present invention.

The present invention addresses and solves the corrosion problems attendant upon electroplated or electroless plated Cu metallization in a cost effective, simplified manner. In various embodiments of the present invention, the foregoing objective is achieved by initially depositing a metal layer comprising an Al or Mg alloy, and then electroplating or electroless plating Cu or a Cu alloy thereon. Low temperature annealing is then conducted, during which Al or Mg from the underlying Al alloy or Mg alloy layer diffuses through the plated Cu or Cu alloy, accumulating at the surface thereof, because of its (i.e., Al or Mg) low solubility in Cu, and forms a passivating or protective oxide coating on and substantially encapsulating the plated Cu or Cu alloy layer, and at the interface between the underlying Al or Mg alloy layer and a dielectric oxide layer, as well as on the underlying layer. As used throughout this application, the expression "Cu metallization" denotes electroplated or electroless plated Cu or a Cu alloy.

The particular temperature and the thickness of the underlying Al alloy or Mg alloy layer can be optimized in a particular situation. For example, it has been found that an Al alloy or Mg alloy layer having a thickness of about 50 Å to about 1500 Å is suitable in practicing the present invention. An annealing temperature of about 150° C. to 450° C. has been found effective in diffusing Mg or Al through a Cu metallization and to form an effective protective encapsulating oxide on the exposed surface of the Cu metallization, and on the exposed surface of, and at the interface between, the Al or Mg alloy layer and the dielectric oxide layer. The time of annealing can be optimized in a particular situation depending upon the dimensions of the Cu metallization, annealing temperature and particular Al or Mg alloy.

The embodiments of the present invention for producing protective oxide self-encapsulated Cu metallization are particularly applicable in conjunction with damascene techniques wherein an opening is formed in a dielectric layer, such as a silicon oxide, e.g. silicon dioxide. The present invention, however, is not limited to dielectric layers comprising silicon oxide, but can be employed in the context of various dielectric materials, such as low dielectric constant polymers.

Thus, in accordance with the present invention, Cu metallization having a protected, self-encapsulated oxide layer is formed in a damascene opening in a dielectric layer. The damascene opening can be a trench, in which case the Cu metallization forms an interconnection line, or a via/contact hole in which case the Cu metallization forms a via/contact. Double damascene techniques can be employed in which the opening contains a first portion forming a trench and a second portion forming a via/contact hole in communication with the trench, in which case the Cu metallization comprises a first section filling the trench and forming an interconnection line and a second portion filling the hole and forming a contact/via with the interconnecting line electrical connection. The present invention advantageously enables filling openings having high aspect ratios, e.g., greater than about 3:1 with improved uniformity.

Embodiments of the present invention include depositing a diffusion barrier layer prior to depositing the Al alloy or Mg alloy layer, for even greater diffusion prevention. Such a diffusion barrier layer can comprise any of a variety of metals, such as tantalum (Ta), Ta alloys, W or W alloys, and titanium (Ti) or Ti alloys. The diffusion barrier layer can be formed at a thickness of about 50 Å to about 1,500 Å. Optionally, an adhesion promoting layer can be deposited prior to depositing the diffusion barrier layer. A suitable adhesion promoting layer comprises Ti and has a thickness of about 50 Å to about 1,500 Å. The adhesion promoting layer as well as diffusion barrier layer can be deposited by any of various conventional deposition techniques, such as PVD or CVD.

In other embodiments of the present invention, a seed layer is deposited on the Al alloy or Mg alloy layer for enhanced nucleation and adhesion of the electroplated or electroless plated Cu or Cu alloy layer. The seed layer can comprise an alloy of Cu and any of various alloying elements such as Mg, Al, Zinc (Zn), Zirconium (Zr), tin (Sn), nickel (Ni), palladium (Pd), silver (Ag) or gold (Au). The seed layer can be sputter deposited or deposited by CVD.

Embodiments of the present invention include electroless plating or electroplating various Cu alloys, such as alloys of Cu with Mg, Zn, Zr, Sn, Ni, or Pd. After electroplating or electroless plating Cu or Cu alloy on the Al alloy or Mg alloy layer, CMP is typically performed to provide a planarized surface. Low temperature annealing is then conducted to diffuse Al atoms or Mg atoms from the underlying Al alloy or Mg alloy layer through the Cu metallization and accumulate on the surface thereof to form a passivating protective aluminum oxide ($Al_2O_3$) or magnesium oxide (MgO) self-encapsulating coating. Advantageously, the protective encapsulating oxide coating prevents corrosion of the Cu metallization and prevents diffusion of Cu atoms from the Cu metallization through the dielectric layer into the silicon elements. Thermal annealing can be conducted in a hydrogen atmosphere, e.g., an atmosphere containing up to 100% hydrogen, e.g., 1% hydrogen or 5% hydrogen, or an atmosphere of pure ammonia ($NH_3$).

An embodiment of the present invention is schematically illustrated in FIGS. 1–4, wherein similar elements bear similar reference numerals. Adverting to FIG. 1, damascene openings are etched in a conventional manner in a dielectric layer 10, typically comprising silicon dioxide. The damascene openings include a trench 12 and a dual damascene opening comprising via hole 13A in communication with trench 13B. As illustrated via hole 13A communicates with an underlying interconnection line 11. However, the present invention is also applicable to a single damascene opening comprising a via hole, a single damascene opening comprising a contact hole or a dual damascene opening comprising a contact hole in communication with a trench.

With continued reference to FIG. 1, after formation of the damascene opening or openings, a layer comprising an Al alloy or a Mg alloy 14, typically containing about 0.1 to about 90 atomic percent of Al or Mg, respectively, is deposited to line the damascene openings. The Al or Mg alloys can contain such alloying elements as Cu, Ta, W, silicon (Si) or nitrogen (N). The Al alloy or Mg alloy can be deposited by a PVD technique, such as sputtering, or a CVD technique. Typically the Al alloy or Mg alloy layer is deposited to a thickness of about 50 Å to about 1500 Å. As shown in FIG. 1, the Al alloy layer or Mg alloy layer 14 lines the damascene openings as well as the upper surface of dielectric layer 10.

Figure 2:
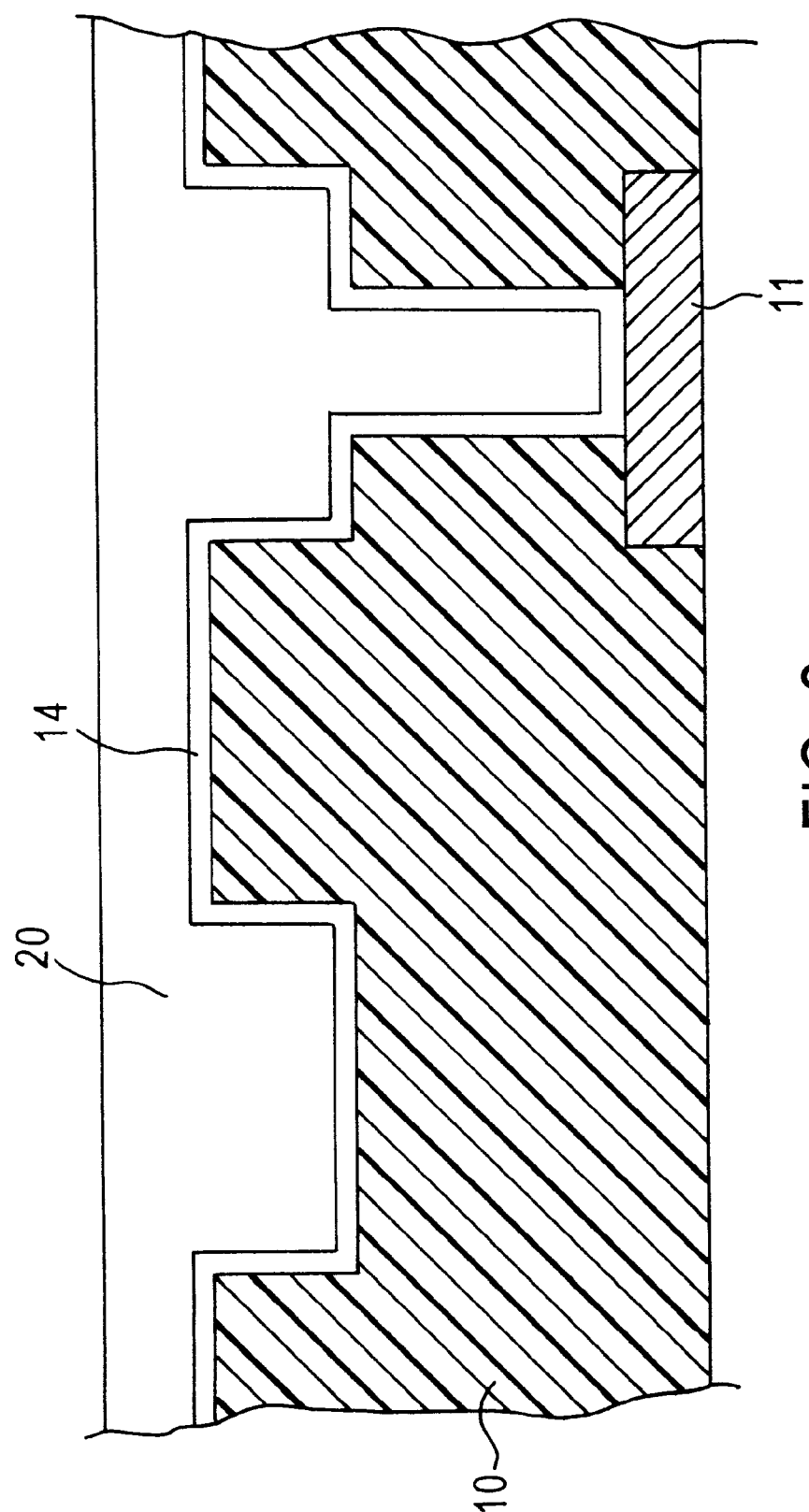

Adverting to FIG. 2, a Cu or Cu alloy layer 20 is then electroplated or electroless plated on the surface of the Al or Mg alloy layer 14. Suitable Cu alloys include alloys of Cu with any of various metals, such as Mg, Sn, Zn, Pd, Au, Ag, Zr and Ni.

Figure 3:
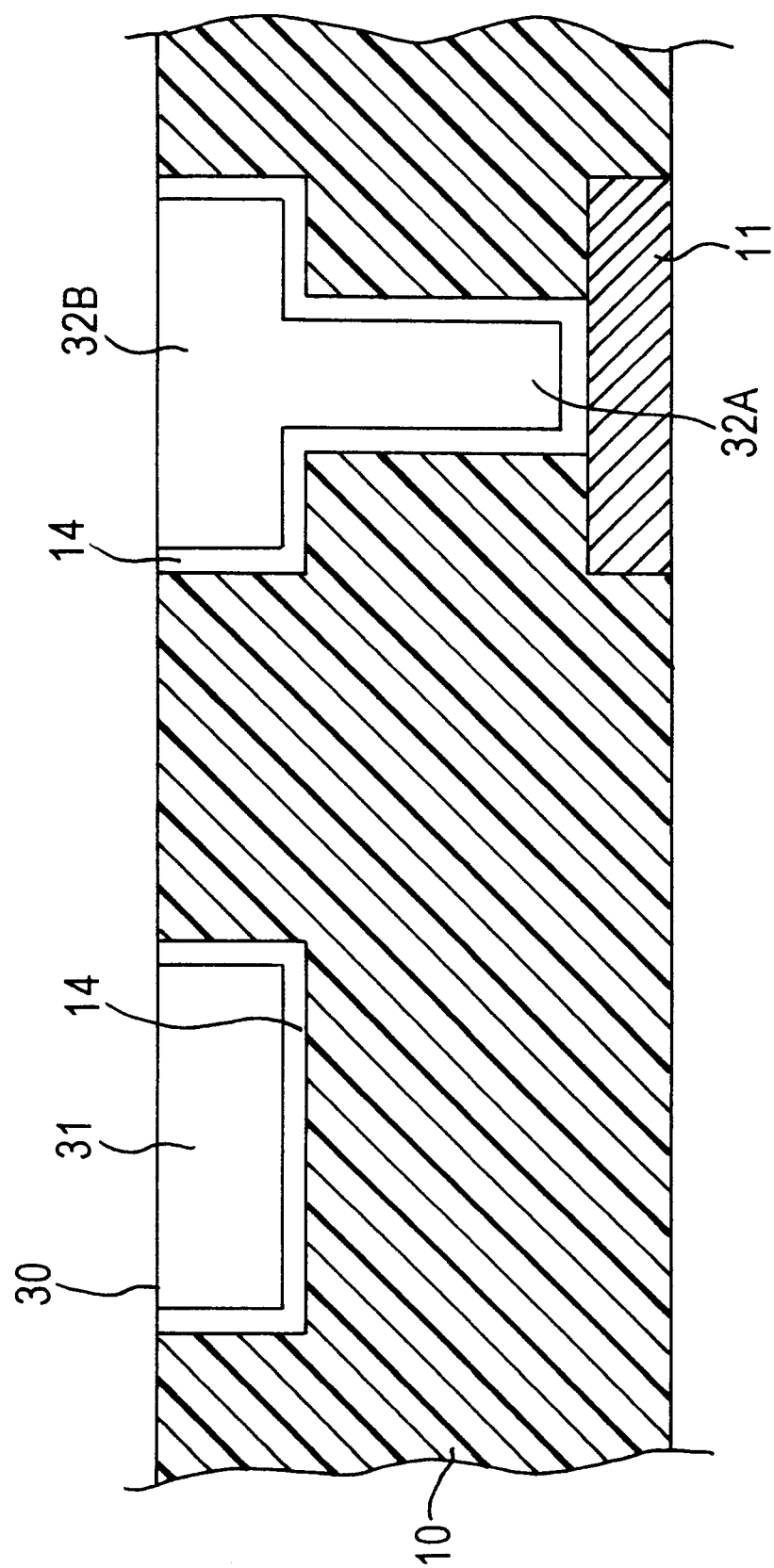

Subsequently, as shown in FIG. 3, CMP is performed to provide a planarized upper surface 30, Cu metallization interconnection line 31 is formed in trench 12 (FIG. 1), while a dual damascene Cu metallization structure comprising via 32A connected to interconnection line 32B is formed via hole 13A and trench 13B (FIG. 1)

Figure 4:
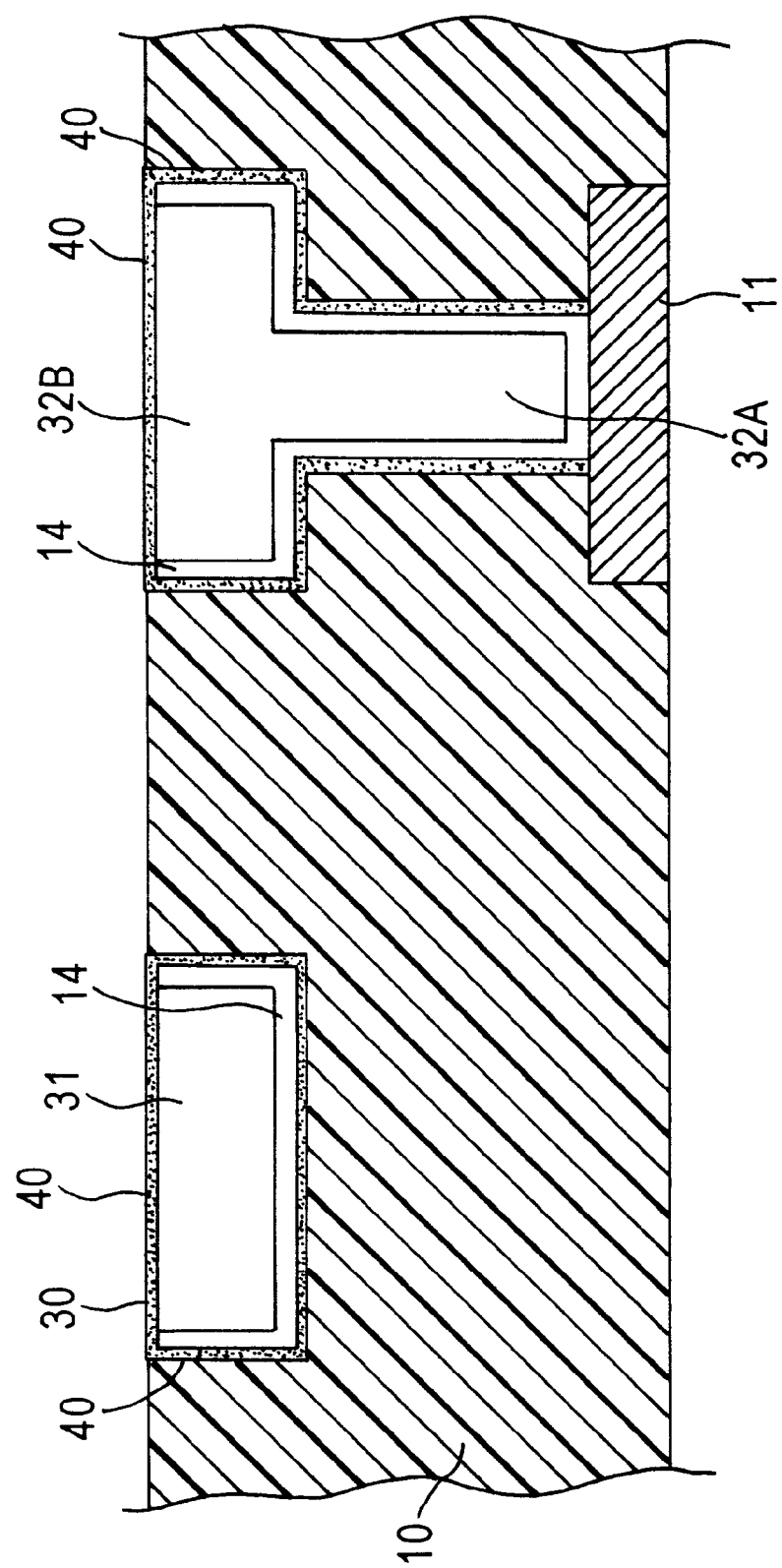

Adverting to FIG. 4, subsequent to planarization, thermal annealing is conducted at a relatively low temperature of about 150° C. to 450° C., as in a hydrogen or ammonia ambient. During thermal annealing, Al atoms or Mg atoms from underlying layer 14 diffuse through the Cu metallization, accumulate on the surface thereof and oxidize to form a self-passivating, self-encapsulating oxide layer 40 on the exposed interconnection line 31 and on the exposed dual damascene structure comprising via 32A and interconnection line 32B. In addition, a self-passivating oxide layer 40 is formed on the exposed surface of, and at the interface between, underlying layer 14 and dielectric layer 10 when employing an oxide dielectric layer. The self-encapsulating oxide 40, typically has a thickness of about 20 Å to about 200 Å and prevents corrosion of the Cu metallization as well as diffusion of Cu through dielectric layer 10 to active silicon devices.

Figure 5:
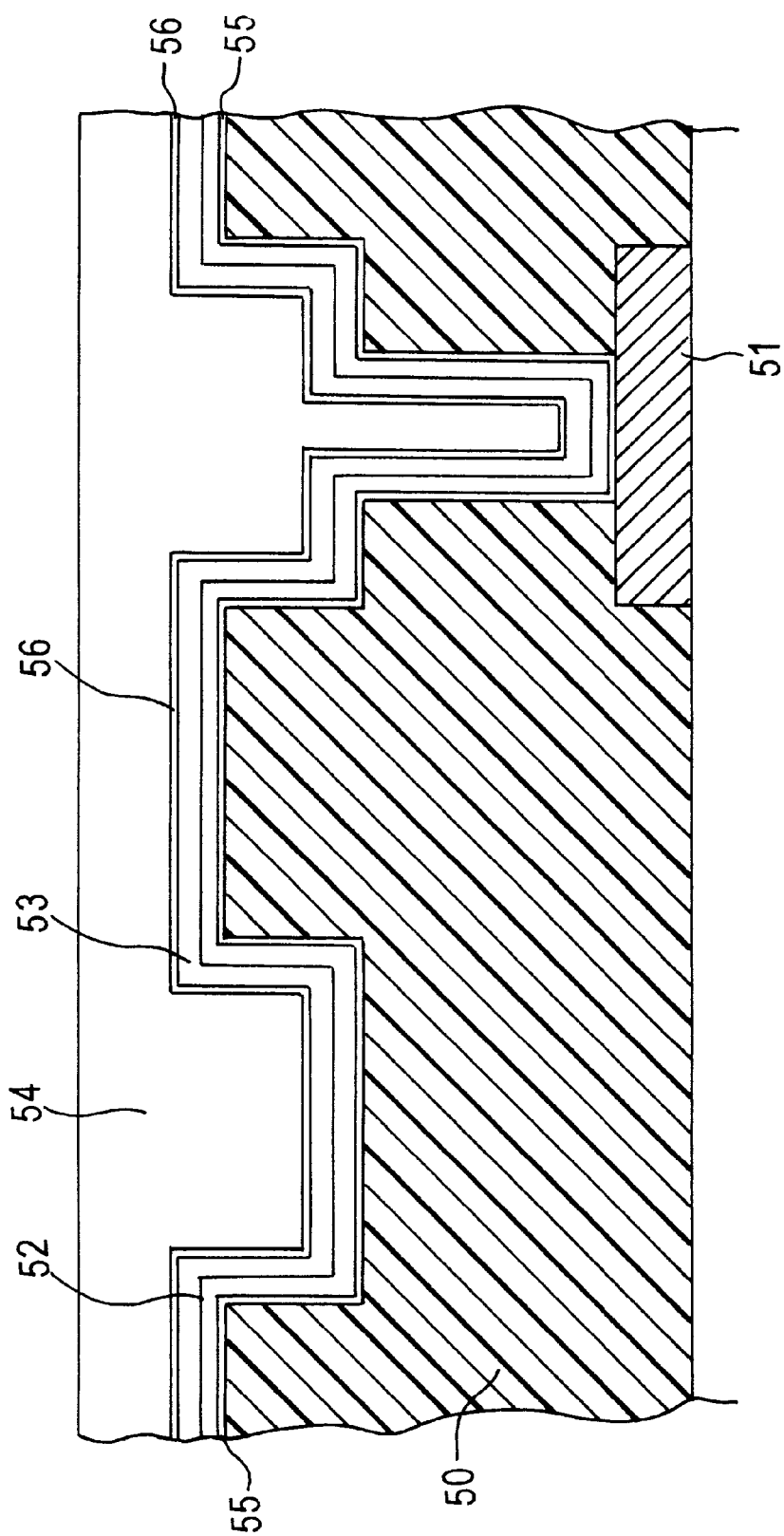
FIGS. 5–7 illustrate sequential phases of a method in accordance with another embodiment of the present invention.
Figure 6:
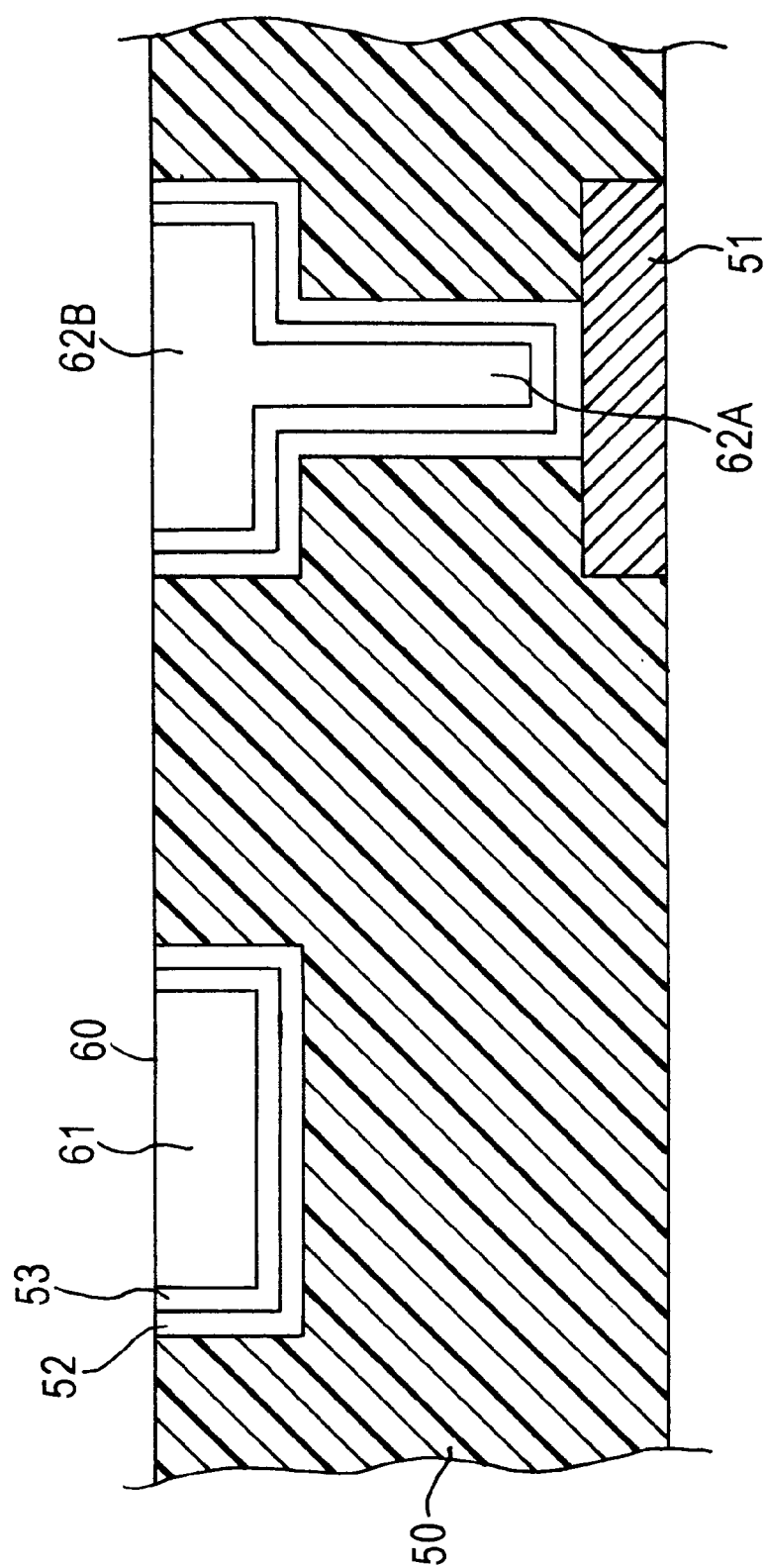
Figure 7:
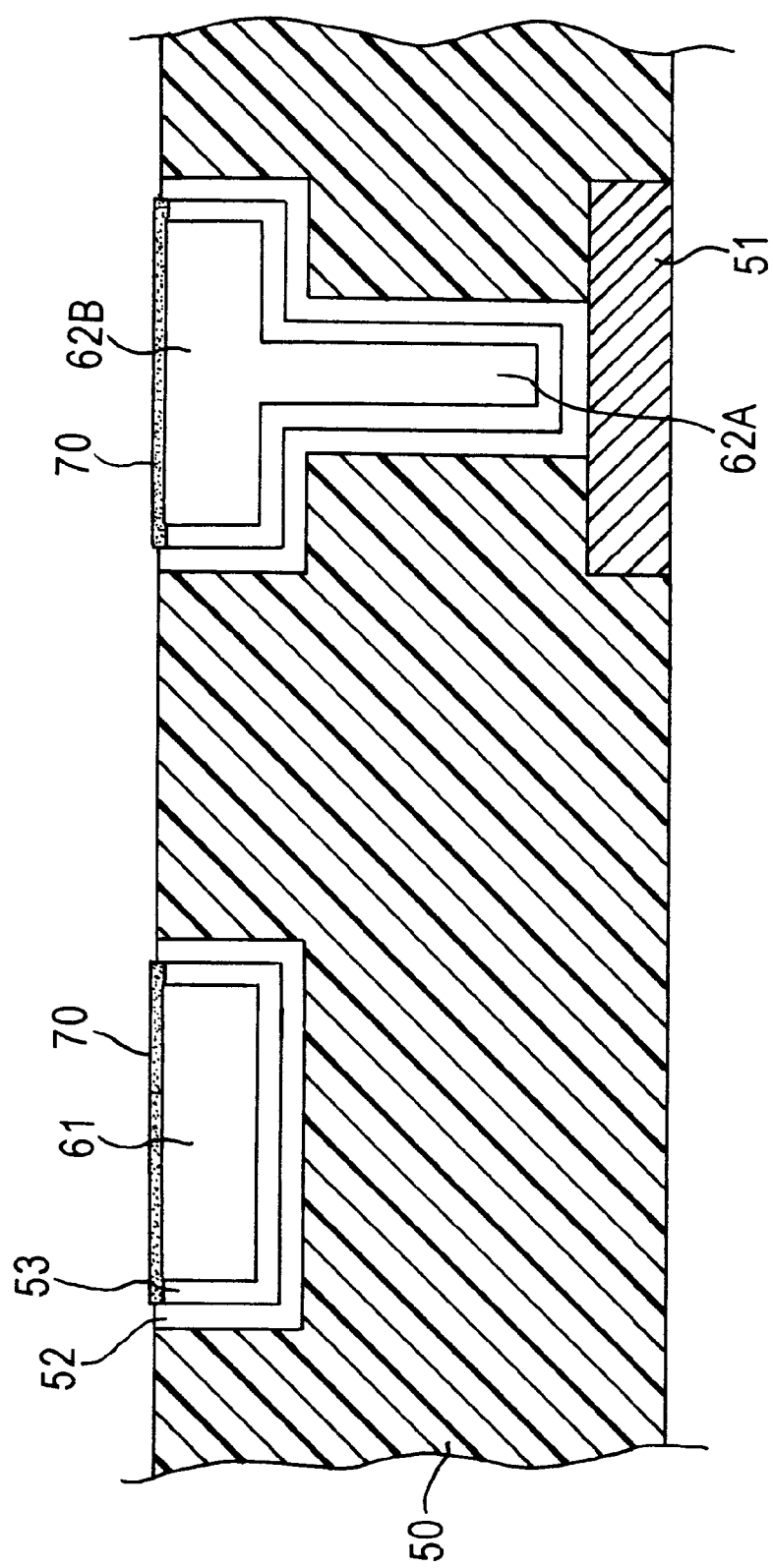

Another embodiment of the present invention is schematically illustrated in FIGS. 5–7, wherein similar elements bear similar reference numerals. The embodiment schematically illustrated in FIGS. 5–7 is similar to the embodiment schematically illustrated in FIGS. 1–4, except that an initial barrier layer 52 is deposited in the damascene openings in dielectric layer 50 formed over conductive line 51. Barrier layer 52 provides additional protection against diffusion of Cu atoms from the Cu metallization through dielectric layer 50. Suitable barrier layers can include Ti, W, Sn, Si, N, Pd, Ta, and alloys thereof. After deposition of the barrier layer 52, Al or Mg alloy layer 53 is deposited on barrier layer 52 lining the damascene openings. Cu metallization 54 is then deposited filling the damascene openings and extending above the upper surface of substrate 50.

Adverting to FIG. 6, CMP is then conducted to form planarized upper surface 60. The resulting Cu metallization comprises interconnection line 61 and a dual damascene Cu metallization structure comprising via 62A electrically connected to interconnection line 62B. Thermal annealing is then conducted, during which Al atoms or Mg atoms from underlying layer 53 diffuse through the Cu metallization, accumulate on the exposed surface thereof, and react with oxygen to form a self-passivating Al oxide or Mg oxide layer 70 encapsulating interconnection 61 and dual damascene Cu metallization 62A, 62B.

Other embodiments of the present invention, include initially depositing an adhesion promoting layer prior to depositing the diffusion barrier layer 52, as illustrated by reference numeral 55 in FIG. 5. Such adhesion promoting layers can comprise materials such as chromium (Cr), Ta, vanadium (V), and molybdenum (Mo).

Other embodiments of the present invention include depositing a seed layer on the Al alloy or Mg alloy layer to improve nucleation and adhesion of the Cu metallization, as illustrated by reference numeral 56 in FIG. 5. Such seed layers can include various Cu alloys, such as a Cu alloyed with Mg, Al, Zn, Zr, Sn, Ni, Pd, Ag or Au. The adhesion promoting layer 55 and seed layer 56 are now shown in FIGS. 6 and 7 for illustrative clarity.

In accordance with the present invention, Cu metallization structures are formed in an efficient, cost-effective manner. The use of Al alloys or Mg alloys avoids the difficulty in plating Cu directly on Al or Mg, since Al and Mg is easily dissolved in a plating solution. The self-encapsulated Cu metallization formed in accordance with the present invention is particularly advantageous in forming inlaid Cu metallization interconnection patterns, particularly in various types of semiconductor devices having sub-micron features and high aspect ratio openings.

In the previous descriptions, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A semiconductor device having an interconnection pattern comprising:

a dielectric layer having an opening therein; and a composite metal layer inlaid in the opening, the composite metal layer comprising:

a metal layer comprising a magnesium alloy lining the entire opening;

a plated layer, comprising an upper surface, comprising electroplated or electroless plated copper or a copper alloy on the metal layer filling the opening; and a layer of magnesium oxide, formed: (a) directly on the upper surface of and encapsulating the plated layer; and (b) directly on the entire surface of the metal layer lining the opening which is between the metal layer and the dielectric layer.

2. The semiconductor device according to claim 1, wherein the metal layer comprises an alloy containing about 0.1 to about 90 atomic percent Mg.

* * * * *